United States Patent [19]

Huq et al.

[11] Patent Number: 5,434,899
[45] Date of Patent: Jul. 18, 1995

[54] PHASE CLOCKED SHIFT REGISTER WITH CROSS CONNECTING BETWEEN STAGES

[75] Inventors: Ruquiya I. A. Huq, Plainsboro; Sherman Weisbrod, Skillman, both of N.J.

[73] Assignee: Thomson Consumer Electronics, S.A., France

[21] Appl. No.: 288,793

[22] Filed: Aug. 12, 1994

[51] Int. Cl.$^6$ .............................................. G11C 19/28
[52] U.S. Cl. ...................................... 377/78; 377/79; 327/212
[58] Field of Search .......................... 377/77, 78, 79; 327/208, 212

[56] References Cited

U.S. PATENT DOCUMENTS

| | | | |
|---|---|---|---|
| 3,877,321 | 3/1975 | Matsue | 377/79 |
| 4,017,741 | 4/1977 | Briggs | 377/79 |
| 4,951,303 | 8/1990 | Larson | 377/79 |
| 5,055,709 | 10/1991 | Smith | 307/279 |
| 5,055,720 | 10/1991 | Tiede | 307/279 |
| 5,136,622 | 8/1992 | Plus | 377/78 |
| 5,222,082 | 6/1993 | Plus | 377/79 |

Primary Examiner—John S. Heyman
Attorney, Agent, or Firm—Joseph S. Tripoli; Joseph J. Laks; Sammy S. Henig

[57] ABSTRACT

A shift register for scanning a liquid crystal display includes cascaded stages. A given stage is formed with an input transistor switch that is responsive to an output pulse of a stage upstream in the chain of the cascaded stages. The input transistor switch charges a capacitance associated with a control electrode of a switched pull-up output transistor. The voltage in the capacitance conditions the output transistor for generating an output pulse when subsequently a clock signal occurs to the output transistor. A clamping transistor discharges the capacitance in a manner to prevent further generation of the output pulse when subsequent pulses of the clock signal occur. The clamping transistor is responsive to an output pulse of a stage downstream in the chain. An impedance that is developed at the control electrode is substantially higher after the clamping operation occurs and remain high for most of the vertical interval.

12 Claims, 4 Drawing Sheets

PHASE CLOCKED SHIFT REGISTER WITH CROSS CONNECTING BETWEEN STAGES

This invention relates generally to shift registers and particularly to a shift register stage useful as a select line scanner for liquid crystal displays.

Liquid crystal television and computer displays (LCDs) are known in the art. For example, see U.S. Pat. Nos. 4,742,346 and 4,766,430, both issued to G. G. Gillette et al. Displays of the type described in the Gillette patents include a matrix of liquid crystal cells which are arranged at the crossovers of data lines and select lines. The select lines are sequentially selected by a select line scanner to produce the horizontal lines of the display. The data lines apply the brightness (gray scale) signals to the columns of liquid crystal cells as the select lines are sequentially selected.

Preferably, the drive circuitry, which drives the select line scanner, which selects the horizontal lines to be displayed, is fabricated directly onto the same substrate and at the same time as the liquid crystal cells are fabricated. Also, because a large number of data lines and select lines are required for a television or computer display, and because the small pixel pitch limits the space available for laying out the driver circuitry, it is desirable to keep the circuitry as simple as possible.

FIG. 1 illustrates an example of a known scan register described in U.S. Pat. No. 5,222,082, which may be integrated with a liquid crystal display device. This register is driven with multiphase clocking signals C1, C2, C3, with different ones of the clock phases applied to different ones of the scan register stages 11.

FIG. 2 illustrates one of the scan register stages in detail. The scan register stage includes an input section including transistors 18 and 19, an intermediate section including transistors 20 and 21 and an output section including transistors 16 and 17.

The output section is arranged as a push-pull amplifier, with a clocked supply potential connected to its supply connection 14. An output is accessed at the interconnection of the transistors 16 and 17.

The input section is arranged as a switched amplifier to exhibit a predetermined potential during the clock phase applied to the supply terminal of the output section. The output signal, P1, of the input stage, is coupled to drive the output transistor 16. More particularly the output, P1, follows the input signal applied to the gate electrode of transistor 18. The output of the input section will be high when the clock phase applied to terminal 14 goes high, and a high level is translated to the output terminal 13. The high level at node P1 is retained at node P1 until the occurrence of a clock phase C3 when the input signal is low. Thus the gate of the output transistor 16 will be at a high level when the clock C1 goes high providing a charging path to output 13 and when clock C1 goes low, providing a path to discharge the output node 13.

The intermediate section is arranged as a clocked inverting amplifier responsive to the input signal. The output of the intermediate stage is coupled to the gate electrode of the pull down transistor 17 of the output stage. The intermediate stage includes pull up and pull down transistors 20 and 21 respectively. The conductance of transistor 21 is greater than that of transistor 20 so that if both transistors 20 and 21 are conducting concurrently, the output potential at node P2 will remain low. Thus if the clock applied to transistor 20 is high when the input signal is high, the output transistor 17 will be maintained in a non-conducting state. However since the application of the stage is as a scan register, input signal pulses occur relatively infrequently. As a result node P2 will normally be charged high for every clock pulse of clock phase C3 and output transistor 17 will normally be conducting.

The drains of transistors 18 and 20 receive a relatively positive biasing voltage $V_{DD}$ of about 16 volts. Thus node P2 is normally biased at about 16 volts. This places excessive stress on the gate electrodes of transistors 19 and 17 which tends to cause a considerable rise in their respective threshold voltages over time. As the threshold of transistor 19 increases, its ability to discharge node P1 decreases, and more time is required to turn off transistor 16. The result is that some of the clock C1 voltage may leak onto the output node 13 and undesirably affect subsequent register stages as well as erroneously addressing an LCD row of pixels.

It may be desirable to reduce the aforementioned excessive stress on the gate electrodes of the transistors in the shift register using, for example, a total of no more than four transistors in each stage of the shift register.

A shift register embodying an aspect of the invention includes an arrangement for generating a phase shifted clock signals and a plurality of cascaded stages. A given one of the cascaded stages includes an output transistor responsive to a first clock signal of the clock signals for generating an output pulse at an output of the given stage. The given stage includes an input switching arrangement responsive to an output pulse developed at an output of a second of the cascaded stages when a clock signal that is phase shifted with respect to the first clock signal occurs. The input switching arrangement generates a control signal that is stored in a capacitance. The capacitance is coupled to a control electrode of the output transistor. The control signal conditions the output transistor for generating the output pulse of the given stage when the first clock signal occurs. A clamping transistor has a conduction path coupled to the control electrode of the output transistor and is responsive to an output pulse developed at an output of a stage of the cascaded stages when a clock signal that is phase shifted with respect to the first clock signal occurs. The clamping transistor clamps the control signal to a level that prevents the output transistor from generating an output pulse when a following pulse of the first clock signal occurs. After the signal is clamped, the clamping transistor develops an impedance in the control electrode of the output transistor that is substantially higher than when the signal is clamped.

FIG. 3 illustrates an exemplary stage n, embodying an aspect of the invention, of a shift register 100 of FIG. 4.

Figure 4:
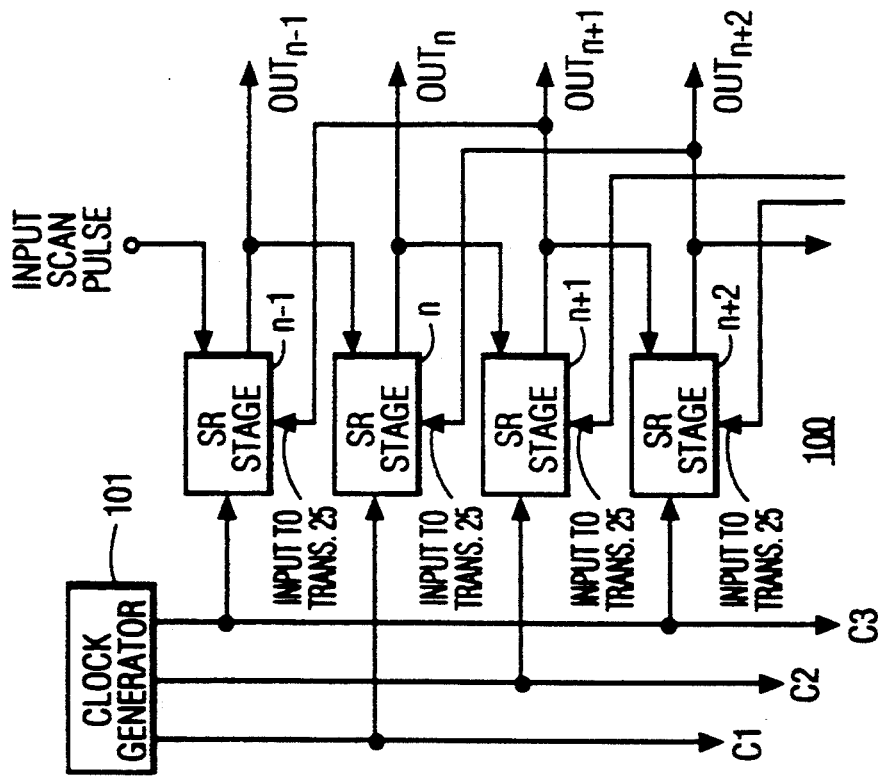
FIG. 4 is a block diagram of a shift register including a cascade connection of a number of stages illustrated in FIG. 3.
Figure 1:
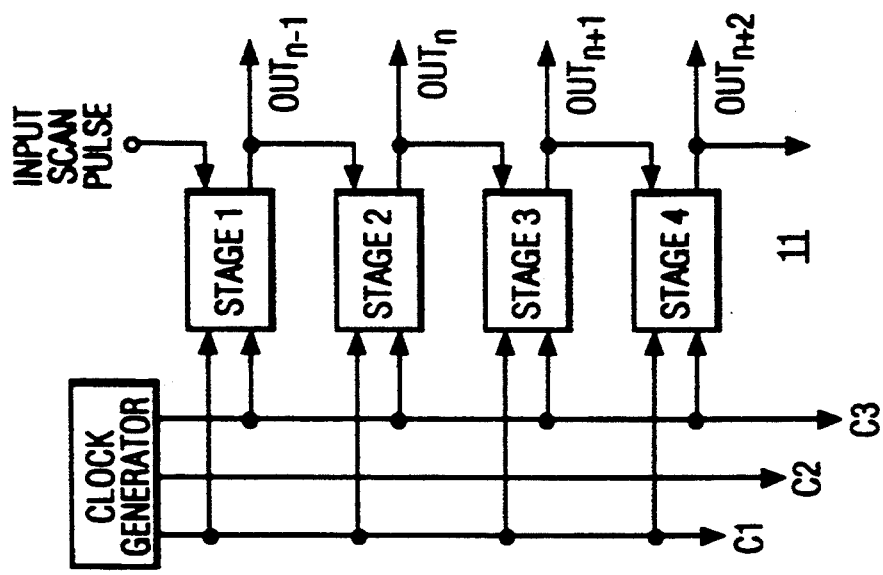
FIG. 1 is a block diagram of a prior art shift register including a plurality of cascaded stages.
Figure 2:
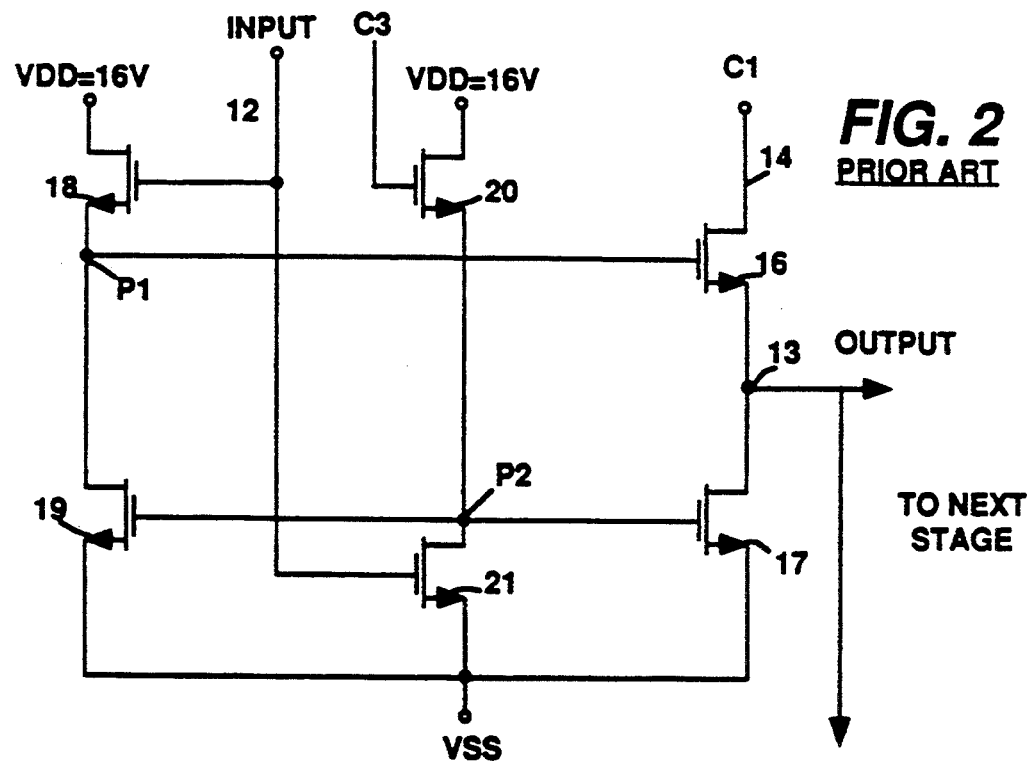
FIG. 2 is a schematic diagram of a known shift register stage which may be utilized in the FIG. 1 shift register.
Figure 3:
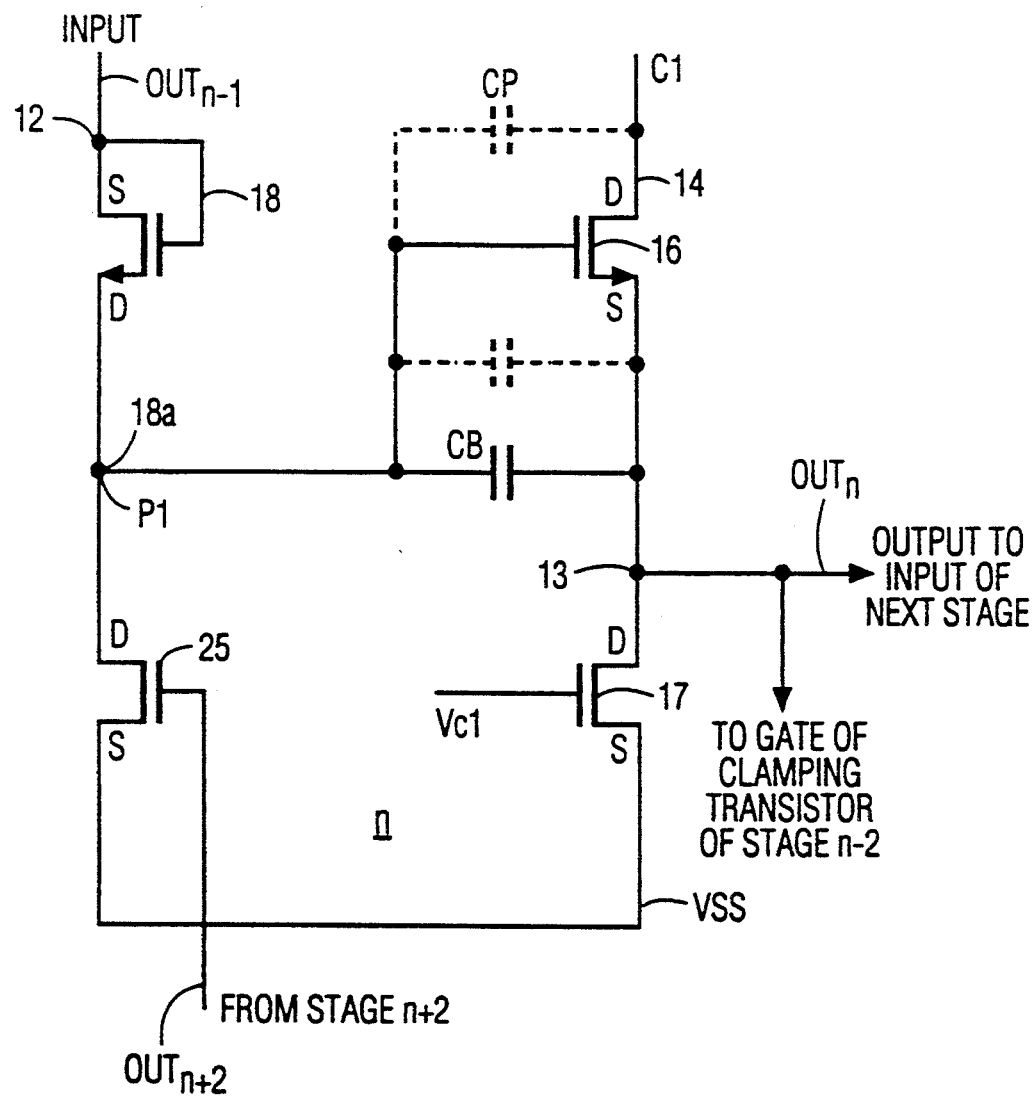
FIG. 3 is a schematic diagram of a shift register stage embodying the present invention.

Similar symbols and numerals in FIGS. 3 and 4 indicate similar items or functions.

Figure 5:
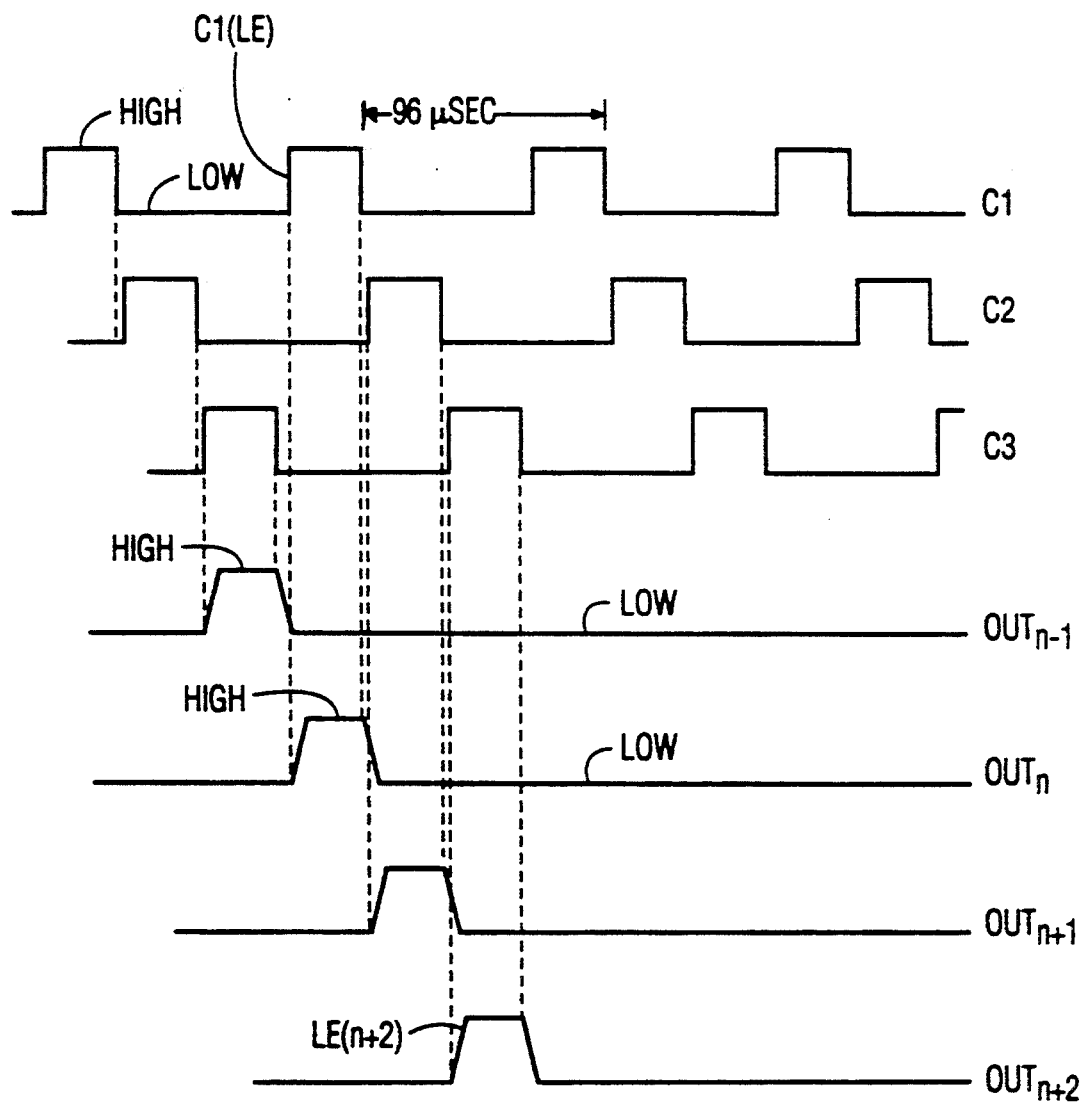
FIG. 5 is a diagram of the relative timing of the output signals and the respective clock signals occurring at respective nodes of the FIGS. 4 shift register utilizing stages illustrated in FIG. 3.

In shift register 100 of FIG. 4, stages n−1, n, n+1 and n+2 are coupled to one another in a cascade configuration. An output signal of a given stage is coupled to an input of the immediately following stage in the chain. For example, an output pulse $OUT_{n-1}$ of a preceding stage n−1 in the chain of register 100 is coupled to an input terminal 12 of stage n of FIG. 3. Illustratively, only four stages, n−1, n, n+1 and n+2 are shown. However, the total number of stages n in the chain of register 100 is substantially larger. A clock generator 101 of FIG. 4 produces a three-phase clock signal, clock signals C1, C2 and C3 having waveforms that are shown in FIG. 5. Similar symbols and numerals in FIGS. 3-5 indicate similar items or functions.

The pulse of signal $OUT_{n-1}$ of FIG. 5 is produced when the pulse of clock signal C3 is applied to stage n−1. Signal $OUT_{n-1}$ of FIG. 3 is developed at an input terminal 12 of stage n. Signal $OUT_{n-1}$ at the HIGH level is coupled via transistor 18 operating as a switch to a terminal 18a for developing a control signal P1. Signal P1 at the HIGH level is temporarily stored in an inter-electrode capacitance, not shown, and in a capacitor CB. Signal P1 that is developed at the gate of an output transistor 16 of FIG. 3 conditions output transistor 16 for conduction. When clock signal C1 of FIG. 5 occurs, signal C1 that is developed at a terminal 14 of FIG. 3 or source electrode of transistor 16 is coupled via an inter-electrode capacitance CP in phantom and capacitance CB to the gate electrode of transistor 16, or terminal 18a, for turning on the conditioned transistor 16. Consequently, an output pulse signal $OUT_n$ is developed at a drain terminal 13. Signal OUT is applied to the input terminal of subsequent stage n+1 of FIG. 4. Stage n+1 operates similarly to stage n except for utilizing clock signal C2, instead of clock signal C1 in stage n, for turning on the corresponding transistor. When clock signal C1 attains the inactive LOW level, transistor 16 remains on until signal P1 goes low. Signal OUT goes low by virtue or discharge through transistor 16 when clock signal C1 is low. A transistor 17, operating as a pull down resistor, that is coupled to terminal 13, causes signal $OUT_n$ to attain the inactive LOW level again.

A transistor 25 has its drain-source conduction path coupled between terminal 18a and a point of reference potential sufficient to turn pull-up transistor 16 off when transistor 25 is conductive. The gate of transistor 25 is coupled to an output terminal of subsequent stage n+2 in the chain of FIG. 4 and is controlled by an output signal $OUT_{n+2}$.

The pulse of signal $OUT_{n+2}$ of FIG. 5 occurs concurrently with clock signal C3. The pulse of signal $OUT_{n+2}$ causes transistor 25 of FIG. 3 to discharge the aforementioned inter-electrode capacitance CP at terminal 18a. A leading edge LE(n+2) of the pulse of signal $OUT_{n+2}$ of FIG. 5 occurs before a leading edge C1(LE) of the next pulse of clock signal C1. Therefore, transistor 25 of FIG. 3 clamps the signal at terminal 18a to a level that prevents transistor 16 from generating an additional pulse of signal $OUT_n$ when the immediately following pulse of clock signal C1 occurs.

A pulse at each output terminal of register 100 of FIG. 4, for example, the pulse of signal $OUT_{n+2}$ of FIG. 5, occurs only once during a vertical interval of approximately 16.6 millisecond. Therefore, none of the switched transistors 18, 16 and 25 of stage n of FIG. 3 is biased for conduction more than one clock period during each vertical interval. Thus, advantageously, none of the switched transistors is stressed frequently. The only non-switched transistor, transistor 17, that is biased for continuous conduction, is not significantly stressed because its gate voltage may be maintained at a relatively small potential in comparison with the gate voltage of the switched transistors 18, 25 and 16, when conductive. Thus, transistor 17 operates continuously as a pull-down transistor.

In accordance with an aspect of the invention, the impedance at terminal 18a is high during most of the vertical interval. Only when transistors 18 or 25 conduct is the impedance at terminal 18a low. Advantageously, such an arrangement enables the usage of merely four transistors for the entire register stage.

Having the gate and drain electrodes of transistor 18 interconnected makes transistor 18 operating as a diode. Thus, transistor 18 may be replaced with a diode. Diode connected transistor 18 charges the inter-electrode capacitance at terminal 18a to the input pulse amplitude (minus a threshold value) for conditioning transistor 16 to conduction.

As explained before, transistor 25 subsequently discharges the charge of terminal 18a. Since a diode coupled transistor 18 conducts unidirectionally, the potential at terminal 18a may beneficially be boosted to higher potentials when clock signal C1 applied to a supply terminal 14 of output transistor 16 goes high. The gate-to-drain and gate-to-source capacitances of pull-up transistor 16 including capacitance CB couple a substantial portion of the voltage of clock signal C1 at terminals 14 and 13 to terminal 18a, thereby turning transistor 16 hard on.

The output pulses $OUT_{n-1}$–$OUT_{n+3}$ of FIG. 5 are shown as overlapping. The amount of overlap is a function of the amount by which the clock phases overlap. Thus, the desired output pulse overlap is adjustable for a particular application by adjusting the clock phase overlap.

What is claimed is:

1. A shift register, comprising:
   means for generating a plurality of phase shifted clock signals; and
   a plurality of cascaded stages, a given one of said cascaded stages, including:
      an output transistor responsive to a first clock signal of said clock signals for generating an output pulse at an output of said given stage;
      an input switching means responsive to an output pulse developed at an output of a second of said cascaded stages when a clock signal applied thereto that is phase shifted with respect to said first clock signal occurs for generating a control signal that is stored on a capacitance that is coupled to a control electrode of said output transistor in said given stage, said control signal conditioning said output transistor for generating said output pulse of said given stage when said first clock signal occurs; and
      a clamping transistor having a conduction path coupled to said control electrode of said output transistor and being responsive at its control electrode to an output pulse developed at an output of a stage of said cascaded stages when a clock signal that is phase shifted with respect to said first clock signal occurs for clamping said control signals in said given stage to a level that prevents said output transistor from generating an output pulse when a following pulse of said first clock signal occurs, such that, after said signal is clamped, said clamping transistor develops an impedance in said control electrode of said output transistor that is substantially higher than when said signal is clamped.

2. A shift register according to claim 1 wherein said capacitance is formed between electrodes of said output transistor.

3. A shift register according to claim 1 further comprising, a pull-down transistor that is coupled to said output of said given stage and wherein said output transistor provides pull-up operation.

4. A shift register according to claim 3 wherein said pull-down transistor is non-switched.

5. A shift register according to claim 4 wherein said switching means comprises one of a transistor and a diode.

6. A shift register according to claim 1 wherein a total number of switching elements in said stage is not greater than 3.

7. A shift register according to claim 1 wherein said clamping transistor is responsive to an output pulse of said third stage that is downstream of said given stage.

8. A scanning register comprising:
a source of a plurality of clock signals of different phases;
a cascade connection of register stages, wherein clock signals of successive phase are cyclically coupled to successive register stages and wherein each stage comprises:
an input terminal coupled to an output terminal of an adjacent prior register stage and an output terminal coupled to an input terminal of an adjacent following register stage;
a source follower amplifier having supply terminals coupled to a respective clock signal, said source follower amplifier including the serial connection of a transistor and an impedance coupled across said supply terminals, said register stage output terminal formed by an interconnection of said transistor and said impedance, and having an input connection at a control electrode of said transistor; and
an input stage having an output coupled to the input connection of said source follower amplifier and an input coupled to said input terminal, said input stage including an active device for unidirectionally conducting current between said transistor, and a further transistor having a principal conduction path coupled between said control electrode of said transistor and a potential sufficient to render said transistor non conductive, said further transistor having a control electrode connected to an output terminal of a following register stage in said cascade connection.

9. The scanning register set forth in claim 8 wherein said impedance is a still further transistor having a principal conduction path coupled between said interconnection and a supply terminal, and a control electrode coupled to a potential of value to render the impedance exhibited by said principal conduction path of said still further transistor relatively high with respect to the impedance exhibited by said transistor when it is conducting.

10. The scanning register set forth in claim 8 wherein said unidirectional conducting device is a still further transistor having a control electrode connected to said input terminal, and a principal conduction path coupled to the control electrode of said transistor.

11. The scanning register set forth in claim 8 wherein said unidirectional conducting device is a diode.

12. The scanning register set forth in claim 8 wherein said further transistor is coupled to an output terminal of a following stage which will condition said input stage to exhibit high impedance when the clock signal applied to the source follower amplifier exhibits a potential sufficient to condition said source follower amplifier to provide an output signal.

* * * * *

UNITED STATES PATENT AND TRADEMARK OFFICE
CERTIFICATE OF CORRECTION

PATENT NO. : 5,434,899
DATED : July 18, 1995
INVENTOR(S) : Huq et al.

It is certified that error appears in the above-indentified patent and that said Letters Patent is hereby corrected as shown below:

Column 4, line 64, (Claim 1), after "a" (first occurrence) insert
-- third --.

Signed and Sealed this

Fourteenth Day of May, 1996

Attest:

BRUCE LEHMAN

Attesting Officer     Commissioner of Patents and Trademarks